(12) United States Patent
Steffens et al.

(10) Patent No.: US 6,999,482 B2
(45) Date of Patent: Feb. 14, 2006

(54) WAVELENGTH TUNABLE LASER WITH DIFFRACTIVE OPTICAL ELEMENT

(75) Inventors: Wolf Steffens, Herrenberg (DE); Ulrich Kallmann, Tuebingen (DE); Emmerich Mueller, Aidlingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 232 days.

(21) Appl. No.: 10/453,272

(22) Filed: Jun. 3, 2003

(65) Prior Publication Data
US 2004/0022281 A1 Feb. 5, 2004

(30) Foreign Application Priority Data
Aug. 3, 2002 (EP) .................................. 02017446

(51) Int. Cl.
*H01S 3/10* (2006.01)
(52) U.S. Cl. .............................. 372/20; 372/22; 372/25
(58) Field of Classification Search ................. 372/20, 372/22, 25, 98
See application file for complete search history.

(56) References Cited

U.S. PATENT DOCUMENTS

| 5,623,365 | A | * | 4/1997 | Kuba | 359/569 |
| 5,651,018 | A | | 7/1997 | Mehuys et al. | 372/50 |
| 6,246,707 | B1 | * | 6/2001 | Yin et al. | 372/25 |
| 6,256,436 | B1 | * | 7/2001 | Nakama | 385/37 |
| 6,292,297 | B1 | * | 9/2001 | Danziger et al. | 359/575 |
| 6,519,269 | B1 | * | 2/2003 | Lefevre | 372/20 |
| 6,763,047 | B1 | * | 7/2004 | Daiber et al. | 372/34 |
| 2003/0026302 | A1 | * | 2/2003 | Anthon et al. | 372/29.01 |

FOREIGN PATENT DOCUMENTS

| DE | 4005247 A1 | 12/1990 |
| EP | 0762573 A1 | 3/1997 |

OTHER PUBLICATIONS

Cassidy et al. (Diffractive optical element used in an external feedback configuration to tune the wavelength of uncoated Fabry-Perot diode lasers in Journal of Modern Optics, 1999, vol. 46, No. 7, pp. 1071-1078).*

"Diffractive Optical Element Used In An External Feedback Configuration To Tune The Wavelength Of Uncoated Fabry-Perot Diode Lasers", Cassidy et al., Journal of Modern Optics, 1999 vol. 46, No. 7, pp. 1071-1078.

(Continued)

*Primary Examiner*—Minsun Oh Harvey
*Assistant Examiner*—Dung (Michael) T. Nguyen

(57) ABSTRACT

A wavelength tunable laser resonator includes first and second resonator end reflectors for reflecting a beam of electromagnetic radiation towards each other, the first and second resonator end reflectors defining a resonator having an optical path with a length, a gain medium for generating and/or amplifying and emitting the beam towards the first and second resonator end reflectors, arranged within the resonator, and a diffractive optical element within the optical path to filter a wavelength of the beam and to focus a portion of the beam towards the gain medium. One of the resonator end reflectors are movable with respect to other optical elements within the resonator for increasing or decreasing the length of the optical path. The diffractive optical element is movable with respect to other optical elements within the resonator for adapting the filtered wavelength to the increase or decrease of the optical path length.

13 Claims, 2 Drawing Sheets

OTHER PUBLICATIONS

"Mode-Hop Suppression Of Littrow Grating-Tuned Lasers", Labachelerie et al., Applied Optics, Optical Society of America, vol. 32, No. 3, pp. 269-274.

Patent Abstracts of Japan document No. JP 03 116992.

Patent Abstracts of Japan document No. JP 04072781.

"Using Diffractive Optics For Tuning Custom-Designed Broadband Diode Lasers", Woodworth et al., Conference On Lasers And Electro-Optics, 2002, pp. 222-223.

"Hybrid Diffractive-Refractive Lenses And Achromats", Stone et al., Applied Optics, Optical Society Of America, 1998, vol. 27, No. 14, pp. 2960-2971.

"Mode-Hop-Free Electro-Optically Tuned Diode Laser", Levin et al., Optics Letters, 2002, vol. 27, No. 4 pp. 237-239.

"Precise Wavelength Tuning Of A Dye Laser Using An Active Diffractive Optical Element", Samuels et al., Optics And Laser Technology, 1996, vol. 28, No. 6, pp. 423-429.

* cited by examiner

WAVELENGTH TUNABLE LASER WITH DIFFRACTIVE OPTICAL ELEMENT

BACKGROUND OF THE INVENTION

The present invention relates to a wavelength tunable laser with a diffractive optical element.

Wavelength tunable laser sources are acquiring an increasing importance in industry, particularly in optical communication measurement device industry. A design of a wavelength tunable laser resonator having an external resonator is provided by O. T. Cassidy & Michael Hamp in "Diffractive optical element used in external feedback configuration to tune the wavelength of uncoated Fabry-Perot diode lasers", Journal of Modern Optics, 1999, Vol. 46, No. 7, 1071–1078.

SUMMARY OF THE INVENTION

It is an object of the present invention to provide an improved wavelength tunable laser resonator. The object is solved by the independent claims. Preferred embodiments are provided by the dependent claims.

According to embodiments of the present invention, the wavelength tunable laser resonator comprises a first and a second resonator end reflector. Both reflectors are arranged to reflect an incident beam of electromagnetic radiation towards each other, thus defining a resonator, in which resonance modes form as a result of the interfering electromagnetic waves. The resonator end reflectors can be at least one of fully reflective devices, semitransparent mirrors, retro-reflectors, Bragg-reflectors, etc. The optical path defined in length by said first and second resonator end reflectors can be arranged linearly along a line or can be redirected by means of a diffraction grid or a redirection mirror.

According to embodiments of the present invention any kind of resonator, e.g. a Littmann-resonator (as described in its basics e.g. in "Liu and Littman, Novel geometry for single-mode scanning of tunable lasers, Optical Society of America, 1981"), a Littrow-resonator (as shown e.g. in EP-A-952643), etc. can be realized by the resonator end reflectors and other optical elements, however a linear resonator or a ring resonator, which comprises plane parallel optical paths, are most preferred.

The laser resonator also comprises a gain medium or element for generating and emitting the beam of electromagnetic radiation. Preferably, the gain element is a semiconductor, having waveguiding properties.

A diffractive optical element is arranged within the optical path defined by the resonator end reflectors. The diffractive optical element according to embodiments of the invention is designed to focus incident parallel beams towards a focal point. As opposed to a conventional optical lens, the distance between the focal point and the diffractive optical element (DOE) strongly depends on the wavelength of the incident beams. E.g., for a Fresnel zone plate the focal point distance is approximately proportional to $1/\lambda$, using the paraxial approximation and $\lambda$ being the wavelength of the electromagnetic radiation.

As a wavelength filter the diffractive optical element has to introduce wavelength dependent optical losses into the optical system comprising the resonator end reflectors and the waveguide structure of the gain medium. To achieve low optical losses the diffractive optical element has to transform the divergent beam, originating from the waveguide structure, into a beam, which matches with the geometrical conditions given by the resonator reflector. Beams deviating from that condition will partially or completely leave the resonator, which means an additional optical loss. Due to the wavelength dependent imaging properties of the DOE only one specific wavelength fulfills that geometrical condition, determined by the make of the DOE and the distance between DOE and waveguide structure.

The first and second resonator end reflectors are arranged, such that at least one of the reflectors can be moved with respect to the other optical elements within the resonator for increasing or decreasing the length of said optical path. Performing such a movement, the wavelength of the resonance modes can be tuned. As a result of the tuning movement of at least one of the reflectors, a resonance mode selected by the wavelength filter due to the diffractive optical element shifts in wavelength and leaves the filter function wavelength range provided by the diffractive optical element.

According to the present invention the diffractive optical element is therefore also provided to be movable with respect to the other optical elements within the resonator. Preferably, the diffractive optical element can be moved with respect to the waveguide structure to change the wavelength filter curve in dependence of the tuned wavelength.

According to preferred embodiments, the diffractive optical element may comprise at least one of phase modulation structures or amplitude modulation structures. In both cases an incident beam of light is diffracted, such that superposition of electromagnetic radiation transmitted or reflected by the structures leads to constructive or destructive interference. The structures provided with the diffractive optical element are arranged, such that a constructive interference is enabled at substantially the same position in a distance from said optical diffractive element.

A preferred embodiment of a diffractive optical element is a Fresnel-zone plate. Non-transparent or phase-shifting structures are arranged as concentric circles on a transparent medium alternating with transparent circle structures. The periodicity of the circles increases with distance from the center of the circles. Thus, electromagnetic waves having a given wavelength are diffracted towards, e.g., an axis running through the centre of said concentric circles.

The resulting diffraction angle is stronger for circle-phase or -amplitude structures being more distant from the center rather than for those ones being arranged near the axis. The diffractive optical element according to the embodiment of a Fresnel-zone plate thus acts as a lens having a focal distance.

Embodiments of the present invention offer a particular advantage, that a diffractive optical element can be realized as a substantially flat device. It can thus be arranged particularly near to the laser source or a resonator end reflector, while an image or focus distance can be designed to be essentially small. Moreover, the diffractive optical element serves as a wavelength filter and a collimator lens incorporated into one device. In a further embodiment, the wavelength tunable laser resonator comprises a control unit, which is connected each to a drive for moving at least one of the first or second resonator end reflector and a drive for moving the diffractive optical element. In response to a movement of one of the resonator end reflectors for tuning the wavelength of the resonator, the position of the diffractive optical element is changed. This position change is performed with respect to the gain element and waveguide structure position.

Preferably, a look-up table is provided with the control unit, that attaches resonator end reflector positions to diffractive optical element positions. The look-up table is advantageously established once at an initial tool setup.

It is also possible to measure a current wavelength by means of a portion of a beam being coupled out by means of a beam splitter. The position of the diffractive optical element can then be adjusted in response to that direct measurement.

Furthermore an active control mechanism can be set up, where either one resonator end reflector or the DOE is dithered around a central position. Then, part of the laser light can be analyzed with regard to a physical property like optical power or wavelength. From a phase sensitive analysis with respect to the dithering motion a control signal can be derived, which synchronizes the positions of the resonator end reflector and the DOE.

It is to be understood, that further redirection mirrors or gratings redirecting the optical path within the resonator are to be considered as resonator end reflectors according to the present invention. A movement of these elements can tune the wavelength of a resonator and may thus advantageously be combined with the movable diffractive optical element as a tunable wavelength filter into one resonator.

According to the present invention further miniaturization of wavelength tunable laser resonators is advantageously fostered.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference signs.

DETAILED DESCRIPTION OF EMBODIMENTS OF THE INVENTION

Figure 1:
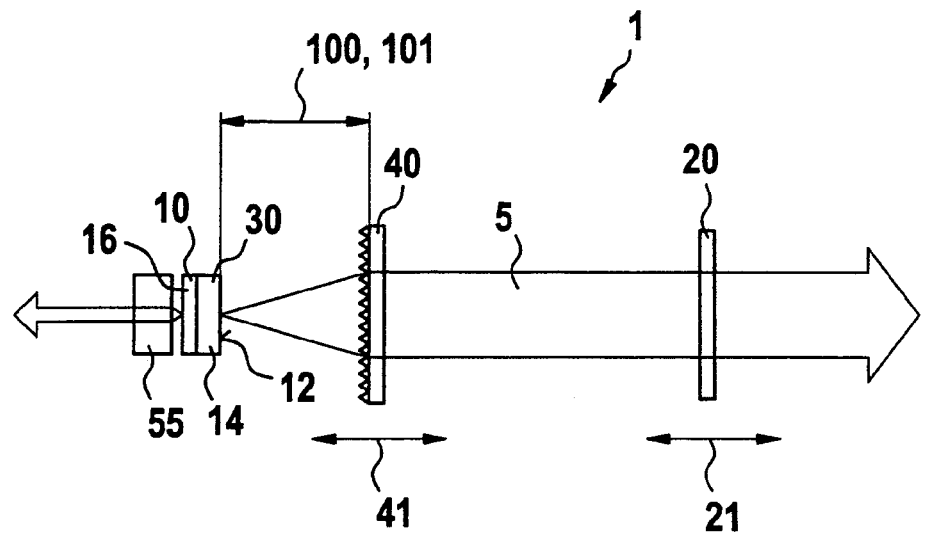
FIG. 1 shows a linear laser resonator having a laser diode as a gain element with a reflective back facet and a diffractive optical element according to a first embodiment.

FIG. 1 shows a first embodiment of a wavelength tunable laser resonator according to the present invention. A laser diode chip 30 comprises a gain medium 14 and a back facet 16. Within the gain medium 14, a beam 5 of electromagnetic radiation is generated and emitted through a front surface 12 towards a diffractive optical element 40. The diffractive optical element 40 comprises a Fresnel-zone plate having concentric circles of phase shift modulation structures arranged on a transparent plate. A diffractive Fresnel lens such defined comprises a focus distance 100, which depends on a wavelength of light being transmitted through the lens.

The diffractive optical element 40 is arranged in a distance towards the laser source 30, which is substantially equal to the focus distance 100. As a result a portion of the beam 5 substantially having a specific wavelength corresponding to the focus distance, which is equal to the distance laser source—diffractive optical element, is collimated into a bundle of substantially parallel light rays traversing to a partially-reflective second resonator end reflector 20.

Beam 5 is substantially reflected back from the second resonator end reflector 20 and focused into an distance 101 towards the laser source 30 by the diffractive optical element 40. Portions of beam 5 not corresponding to the specific wavelength leave the resonator due to not resulting in bundles of parallel light rays. The diffractive optical element 40 acts as a wavelength filter. With respect to the specific wavelength, the image distance 101 is identical to the focus distance 100 in this embodiment.

The back facet 16 of the laser source 30 represents a first resonator end reflector 10 thus defining the optical path length of the resonator 1. As a result, resonance modes form within the resonator 1 having wavelengths, which depend on the optical path length. The distance between the gain medium 14 of the laser source 30 and the diffractive optical element 40 is chosen such as to select one of the modes with said specific wavelength filter. The back facet 16 is partially reflective as well, such that a portion of beam 5 can be outcoupled here as well. A lens 55 serves for collimating the outcoupled beam.

The second resonator end reflector 20 is movable in a first direction 21 to or from the other optical elements within the resonator 1, in particular the back facet 16, for tuning the wavelength of the resonance modes. When these wavelengths shift as a result of tuning, the resonance mode selected by the wavelength filter, i.e. the diffractive optical element 40, leaves the wavelength filter function and would disappear due to being filtered out.

The diffractive optical element 40 is provided with mobility into a second direction 41. Thus a movement of diffractive optical element 40 can be performed in order to bring it into a distance towards the laser source 30, that corresponds to a focus distance 100 of the diffractive optical element 40 valid for the shifted wavelength. Thus a movement of diffractive optical element 40 provides a shift of the wavelength filter function, such that the resonator wavelength tuning can be corrected for. As an advantageous result, mode hops can be avoided while performing wavelength tuning.

Figure 2:
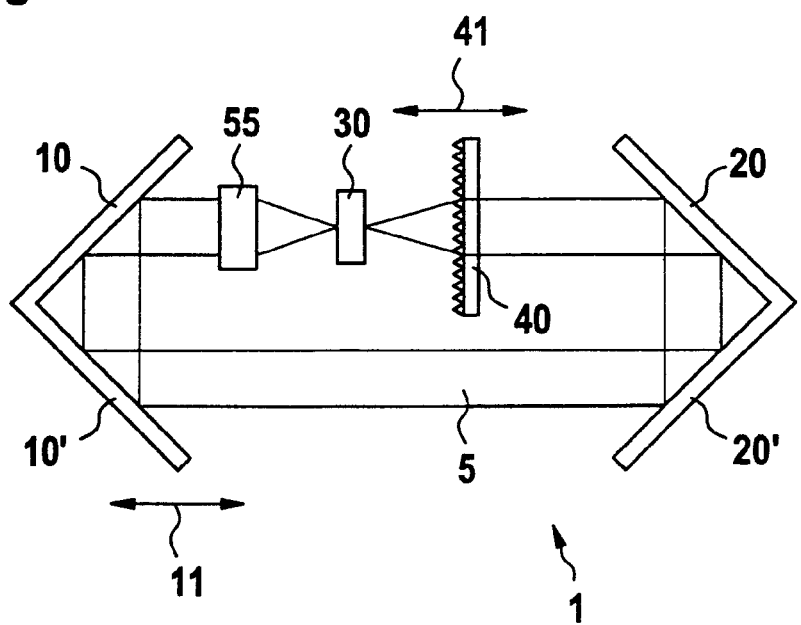
FIG. 2 shows a ring resonator having a diffractive optical element according to a second embodiment.

FIG. 2 shows a second embodiment of the present invention. A ring resonator is defined by first and second resonator end reflectors 10, 10', 20, 20', wherein a beam 5 of electromagnetic radiation is generated and/or amplified by means of the gain medium 14 and emitted into the ring-like optical path of beam 5. A diffractive optical element 40 is arranged within the optical path of the first direction and a collimating optical lens 55 is arranged within the optical path of the second direction. The optical path length can be increased by moving the set of first resonator end reflectors 10, 10' into a direction 11. The diffractive optical element 40 comprising the same features as in the first embodiment is arranged being movable in direction 41 for adjusting the filter wavelength in response to the wavelength tuning.

Figure 3:
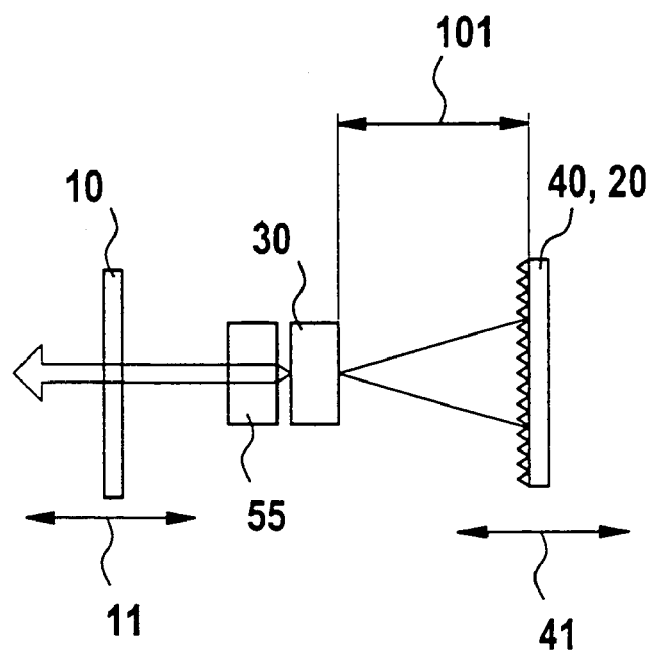
FIG. 3 shows a linear laser resonator having a laser diode as a gain element, which is antireflection coated on both facets, and a diffractive optical element according to a third embodiment.

FIG. 3 shows a third embodiment of the present invention. A linear resonator is displayed similar to FIG. 1. However, the diffractive optical element 40 and the second resonator end reflector 20 are represented by the same optical device, the diffractive optical element 40 thus being reflective rather than transmittive in this embodiment. In this embodiment, the image distance 101 is approximately twice the focus distance 100 of the DOE for geometrical reasons.

Since the image distance 101 of the diffractive optical element as compared with the distance towards the laser source provides the filtered wavelength range, the first resonator end reflector 10 is provided to be movable in order to give an additional option to tune the resonator 1. The laser source thus does not have a reflective back facet in this embodiment.

Figure 4:
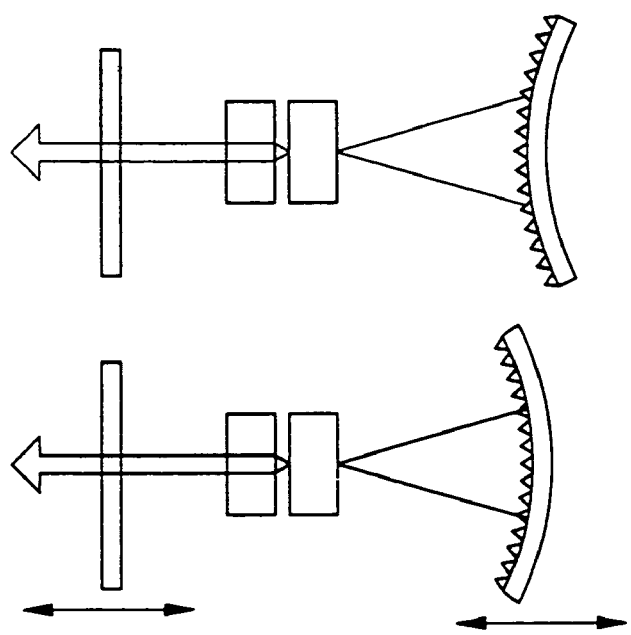
FIG. 4 shows a resonator with curved diffractive optical elements.

FIG. 4 shows further advantageous embodiments of diffractive optical elements 40. Both elements shown are curved in order to either lengthen or shorten a focus or image distance with respect to a Fresnel-zone plate having the same phase structure dimensions but which are arranged on a plane plate.

What is claimed is:

1. A wavelength tunable laser resonator comprising:
   a first resonator end reflector for reflecting a beam of electromagnetic radiation towards a second resonator end reflector,
   said second resonator end reflector for reflecting said beam back towards said first resonator end reflector, said first and second resonator end reflector defining a resonator having an optical path with a length,
   a gain medium for emitting said beam towards said first and second resonator end reflector, said gain medium being arranged within said resonator,
   a diffractive optical element arranged within said optical path and being adapted for filtering said beam in wavelength and focusing at least a portion of said wavelength-filtered beam towards said gain medium at a focal point, wherein a distance between the focal point and the diffractive optical element depends on a wavelength of the beam,
   wherein at least one of said first or said second resonator end reflector is arranged to be movable with respect to other optical elements within said resonator for increasing or decreasing said length of said optical path of said resonator, and
   wherein said diffractive optical element is arranged to be movable with respect to said other optical elements within said resonator for adapting said filtered wavelength to said increase or decrease of said length of said optical path by bringing the diffractive optical element to a distance toward the gain medium that corresponds to a focus distance valid for a resulting shifted wavelength of the beam.

2. The resonator of claim 1,
   wherein said gain medium comprises said first resonator end reflector being arranged as a back facet of said gain medium, and said gain medium having a front surface, through which said beam is emitted towards said second resonator end reflector, and
   wherein said diffractive optical element is designed to transmit said beam being diffracted.

3. The resonator according to claim 1,
   wherein said first resonator end reflector is arranged to be movable with respect to said other optical elements, and
   said diffractive optical element and said second resonator end reflector denote the same optical element, which is arranged to be movable with respect to said other optical elements.

4. The resonator according to claim 1,
   further comprising a control unit and a drive, each for moving said diffractive optical element and said at least one of said first or second resonator end reflector for adjusting the position of said diffractive optical element within said optical path in response to an increase or decrease of said length of said optical path.

5. The resonator according to claim 1,
   wherein said first and said second resonator end reflectors are provided as retro-reflectors such that an optical path defining a ring resonator is formed.

6. The resonator according to claim 5,
   further comprising an optical diode for selecting one beam direction to reduce or avoid spatial hole burning effects within the gain medium.

7. The resonator according to claim 1,
   wherein said diffractive optical element comprises a phase modulation structure for diffracting said beam.

8. The resonator according to claim 1,
   wherein said diffractive optical element comprises an amplitude modulation structure for diffracting said beam.

9. The resonator according to claim 1,
   wherein said diffractive optical element comprises a Fresnel zone plate.

10. The resonator according to claim 1,
    wherein said diffractive optical element comprises a refractive element for additionally refracting electromagnetic radiation diffracted by said diffractive optical element.

11. The resonator according to claim 1,
    wherein said diffractive optical element comprises a diffractive structure having a concave or convex spatial structure for providing a particularly short or long focal distance.

12. The resonator according to claim 1,
    wherein at least said first resonator end reflector, said gain medium, said diffractive optical element and said second resonator end reflector are arranged in a spatially linear resonator substantially within a line without angular redirection of said optical path of said beam.

13. Method for tuning a wavelength of a wavelength tunable laser resonator comprising a first and second resonator end reflector, a diffractive optical element and a gain medium comprising:
    emitting a beam of electromagnetic radiation by said gain medium within said resonator,
    forming a set of resonance modes of said beam within said resonator defined in length by said first and second resonator end reflectors,
    selecting one resonance mode of said beam, said mode having a wavelength,
    focusing said resonance mode of said beam towards said gain medium using said diffractive optical element having an image distance to said gain medium with respect to said wavelength by moving the diffractive optical element to the image distance,
    moving one of the first or the second resonator end reflector for increasing or decreasing the optical path length of said resonator, for tuning the wavelength of said resonance mode of said beam,
    adjusting a distance between the gain medium and said diffractive optical element in response to said wavelength tuning to correct for a different image distance of said diffractive optical element with respect to said tuned wavelength of said resonance mode.

* * * * *